(12) United States Patent
Okita (10) Patent No.: US 9,844,893 B2
(45) Date of Patent: *Dec. 19, 2017

(54) METHOD OF MANUFACTURING SILICON CARBIDE SUBSTRATE

(71) Applicant: Sumitomo Electric Industries, Ltd., Osaka-shi, Osaka (JP)

(72) Inventor: Kyoko Okita, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 93 days.

This patent is subject to a terminal disclaimer.

(21) Appl. No.: 15/098,918

(22) Filed: Apr. 14, 2016

(65) Prior Publication Data

US 2016/0229086 A1 Aug. 11, 2016

Related U.S. Application Data

(63) Continuation of application No. 13/484,724, filed on May 31, 2012, now Pat. No. 9,346,187.

(60) Provisional application No. 61/492,415, filed on Jun. 2, 2011.

(30) Foreign Application Priority Data

Jun. 2, 2011 (JP) .................................. 2011-123928

(51) Int. Cl.
| | | |
|---|---|---|
| *B26D 3/28* | (2006.01) | |
| *B28D 5/04* | (2006.01) | |
| *C30B 29/36* | (2006.01) | |
| *C30B 33/00* | (2006.01) | |
| *C30B 33/06* | (2006.01) | |

(52) U.S. Cl.
CPC ............... *B28D 5/045* (2013.01); *B28D 5/04* (2013.01); *C30B 29/36* (2013.01); *C30B 33/00* (2013.01); *C30B 33/06* (2013.01); *Y10T 83/04* (2015.04)

(58) Field of Classification Search
None
See application file for complete search history.

(56) References Cited

U.S. PATENT DOCUMENTS

| | | |
|---|---|---|
| 4,274,389 A | 6/1981 | White et al. |
| 5,857,454 A | 1/1999 | Shibaoka |
| 5,904,136 A | 5/1999 | Nagatsuka et al. |

(Continued)

FOREIGN PATENT DOCUMENTS

| | | |
|---|---|---|
| CN | 101335205 A | 12/2008 |
| CN | 101360592 A | 2/2009 |

(Continued)

OTHER PUBLICATIONS

Machine trans of Etsuo JP 9-262825 1997.*

*Primary Examiner* — Joseph J Hail
*Assistant Examiner* — Brian Keller
(74) *Attorney, Agent, or Firm* — Drinker Biddle & Reath LLP (57) ABSTRACT

A method of manufacturing a silicon carbide substrate includes the steps of preparing an ingot of single crystal silicon carbide and obtaining a substrate by cutting the ingot. Then, in the step of obtaining a substrate, cutting proceeds in a direction α in which an angle β formed with respect to a <11-20> direction or a <1-100> direction of the ingot is 15°±5° in an orthogonal projection on a {0001} plane.

7 Claims, 7 Drawing Sheets

(56) References Cited

U.S. PATENT DOCUMENTS

| | | |
|---|---|---|
| 6,179,909 B1 | 1/2001 | Banzawa et al. |
| 6,568,384 B1 | 5/2003 | Onizaki |
| 6,923,171 B2 | 8/2005 | Hammer et al. |
| 6,941,940 B1 | 9/2005 | Zavattari et al. |
| 7,022,545 B2 | 4/2006 | Yamada et al. |
| 7,137,865 B2 | 11/2006 | Hammer et al. |
| 7,464,702 B2 | 12/2008 | Matsumoto |
| 8,282,761 B2 | 10/2012 | Rieger et al. |
| 2004/0083863 A1 | 5/2004 | Nakashima |
| 2005/0224783 A1 | 10/2005 | Matsuyama et al. |
| 2005/0230686 A1 | 10/2005 | Kojima et al. |
| 2006/0249135 A1 | 11/2006 | Matsumoto |
| 2007/0105485 A1 | 5/2007 | Matsumoto |
| 2007/0281173 A1 | 12/2007 | Kojima et al. |
| 2008/0277667 A1 | 11/2008 | Matsumoto |
| 2009/0064983 A1 | 3/2009 | Sudarshan et al. |
| 2009/0084373 A1 | 4/2009 | Oishi |
| 2009/0184327 A1 | 7/2009 | Oyanagi et al. |
| 2009/0309105 A1 | 12/2009 | Letts et al. |
| 2010/0006082 A1 | 1/2010 | Glinski et al. |
| 2010/0037880 A1 | 2/2010 | Kawasaki et al. |
| 2011/0042683 A1 | 2/2011 | Kryliouk et al. |
| 2012/0325196 A1 | 12/2012 | Okita et al. |

FOREIGN PATENT DOCUMENTS

| | | | |
|---|---|---|---|
| JP | H09-17755 A | | 1/1997 |
| JP | 09-29734 A | | 2/1997 |
| JP | 1997 9262825 | * | 10/1997 |
| JP | H09-262825 A | | 10/1997 |
| JP | 2002-283340 A | | 10/2002 |
| JP | 2006-190909 A | | 7/2006 |
| JP | 2009-061528 A | | 3/2009 |
| JP | 2009-152622 A | | 7/2009 |
| JP | 4525353 B2 | | 8/2010 |
| JP | 2011-077325 A | | 4/2011 |

\* cited by examiner

METHOD OF MANUFACTURING SILICON CARBIDE SUBSTRATE

This is a continuation application of copending application Ser. No. 13/484,724 filed on May 31, 2012, which claims the benefit of U.S. Provisional Application No. 61/492,415 filed on Jun. 2, 2011; the entire contents of each of these are incorporated by reference herein in their entirety.

BACKGROUND OF THE INVENTION

Field of the Invention

The present invention relates to a method of manufacturing a silicon carbide substrate and more particularly to a method of manufacturing a silicon carbide substrate capable of suppressing variation in plane orientation in a main surface.

Description of the Background Art

In recent years, in order to achieve a higher breakdown voltage and lower loss of a semiconductor device, use thereof in an environment at high temperature and the like, silicon carbide has increasingly been adopted as a material for forming a semiconductor device. Silicon carbide is a wide band-gap semiconductor greater in band gap than silicon conventionally widely used as a material for forming a semiconductor device. Therefore, by adopting silicon carbide as a material for forming a semiconductor device, a higher breakdown voltage, a lower ON resistance of a semiconductor device and the like can be achieved. In addition, a semiconductor device adopting silicon carbide as a material is also more advantageous than a semiconductor device adopting silicon as a material in that deterioration in its characteristics at the time when it is used in an environment at high temperature is less.

A semiconductor device including silicon carbide as a material is manufactured, for example, by forming an epitaxial growth layer on a silicon carbide substrate, fabricating a region in the epitaxial growth layer, in which a desired impurity has been introduced, and forming an electrode. The silicon carbide substrate is generally manufactured by cutting (slicing) a crystal (an ingot) of silicon carbide. Silicon carbide, however, has extremely high hardness and hence cutting thereof is not easy. Therefore, a method of cutting a silicon carbide crystal has variously been studied and various methods have been proposed (see, for example, Japanese Patent Laying-Open No. 2009-61528 (PTL 1)).

With a conventional method of cutting a silicon carbide crystal, however, warpage of an obtained substrate is disadvantageously great. Warpage of a substrate can be lessened by polishing or the like after cutting. If a substrate great in warpage is planarized by polishing or the like, however, a plane orientation of silicon carbide single crystal in a main surface of the substrate varies from place to place. Silicon carbide single crystal has different characteristics depending on a plane orientation of a crystal. Therefore, preferably, warpage is lessened in the stage of cutting a substrate such that variation in plane orientation above in the main surface of the substrate is suppressed.

SUMMARY OF THE INVENTION

The present invention was made to solve such problems and its object is to provide a method of manufacturing a silicon carbide substrate capable of suppressing variation in plane orientation in a main surface.

A method of manufacturing a silicon carbide substrate according to the present invention includes the steps of preparing a crystal of single crystal silicon carbide and obtaining a substrate by cutting the crystal. Then, in the step of obtaining a substrate, cutting proceeds in a direction in which an angle formed with respect to a <11-20> direction or a <1-100> direction of the crystal is 15°±5° in an orthogonal projection on a {0001} plane.

The present inventor conducted detailed studies of approaches for lessening warpage in a stage of cutting a substrate, obtained the following findings, and then derived the present invention.

Namely, as described above, a silicon carbide crystal has extremely high hardness and cutting thereof is difficult. In addition, a silicon carbide crystal has a cleavage plane, and owing to influence by this cleavage plane, anisotropy exists in cutting difficulty. Therefore, cutting can readily be carried out by causing cutting to proceed along a direction of cleavage.

The present inventor's studies, however, clarified that such a cutting method became a factor for aforementioned warpage of a substrate. More specifically, a crystal of hexagonal silicon carbide has two cleavage, directions of a <1-100> direction and a <11-20> direction. The <1-100> direction and the <11-20> direction form 90°. Then, in consideration of an equivalent direction based on crystal symmetry, the cleavage direction above appears every 30° in the {0001} plane. In addition, a degree of cleavage, that is, readiness of development of cracks, is different between the <1-100> direction and the <11-20> direction. Moreover, a front surface and a back surface of a silicon carbide substrate, that is, one surface and the other surface opposed to each other in a cutting region during cutting in progress, are reverse in readiness of development of cracks between the <1-100> direction and the <11-20> direction.

Therefore, for example in a case of cutting of a crystal by wire cutting, if cutting is carried out such that cutting proceeds along one of the cleavage directions above, a wire gradually moves in a <0001> direction because of difference in readiness of development of cracks between one surface and the other surface opposed to each other in the cutting region during cutting in progress. Consequently, warpage is formed in a silicon carbide substrate obtained by cutting.

In contrast, in the method of manufacturing a silicon carbide substrate according to the present invention, cutting proceeds in a direction in which an angle formed with respect to the <11-20> direction or the <1-100> direction of the crystal is 15°±5° in an orthogonal projection on the (0001) plane. Namely, cutting proceeds in a direction significantly distant from a cleavage direction that appears every 30° in the {00011} plane. Therefore, influence by the cleavage direction above is lessened and occurrence of warpage is suppressed. Consequently, even though the substrate obtained by cutting is planarized by polishing or the like, variation in plane orientation in a main surface can be suppressed. It is noted that an angle formed between a direction in which cutting proceeds and the <11-20> direction or the <1-100> direction refers to a more acute angle of angles formed between the direction in which cutting proceeds and the <11-20> direction and the <1-100> direction.

Here, the direction in which cutting proceeds is most preferably such a direction that an angle formed with respect to the <11-20> direction or the <1-100> direction of the crystal is 15° in an orthogonal projection on the {0001} plane. A sufficient effect, however, is obtained so long as an angle formed with respect to this most preferred direction is not greater than 5°. In order to obtain a higher effect, a direction in which cutting proceeds is preferably such a direction that an angle formed with respect to the <11-20> direction or the <1-100> direction of the crystal is 15°±3° in an orthogonal projection on the {0001} plane.

In the method of manufacturing a silicon carbide substrate above, in the step of obtaining a substrate, cutting may proceed in a direction in which an angle formed with respect to the <11-20> direction or the <1400> direction of the crystal is 15°±2° in an orthogonal projection on the {0001} plane. Thus, warpage of a substrate obtained by cutting is further suppressed. Consequently, even though the substrate obtained by cutting is planarized by polishing or the like, variation in plane orientation in a main surface can further be suppressed.

In the method of manufacturing a silicon carbide substrate above, the crystal may grow in a <0001> direction. Thus, a crystal of single crystal silicon carbide can efficiently be fabricated.

In the method of manufacturing a silicon carbide substrate above, the crystal may have a diameter not smaller than 2 inches. As a crystal has a greater diameter, influence by warpage above is greater. Therefore, the present invention capable of lessening warpage above is suitable for a case where a substrate is fabricated from a crystal having a diameter not smaller than 2 inches.

In the method of manufacturing a silicon carbide substrate above, in the step of obtaining a substrate, the crystal above may be cut such that a ratio of a diameter to a thickness of the substrate is not smaller than 100. When a diameter D is greater with respect to a thickness T of the substrate, influence by warpage above is great. In particular, in a case where D/T above is not smaller than 100, variation in plane orientation in a main surface of the substrate due to occurrence of warpage above, is more likely to affect manufacturing of a semiconductor device with the use of the substrate. Therefore, the present invention capable of lessening warpage above is particularly suitable in a case where D/T above is not smaller than 100.

In the method of manufacturing a silicon carbide substrate above, in the step of obtaining a substrate, the crystal above may be cut by wire cutting.

In a case where a crystal is cut by wire cutting, warpage above is particularly likely. Therefore, the present invention capable of lessening warpage above is particularly suitable for a case where a crystal is cut by wire cutting.

As is clear from the description above, according to the method of manufacturing a silicon carbide substrate of the present invention, a method of manufacturing a silicon carbide substrate capable of suppressing variation in plane orientation in a main surface can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings. It is noted that, in the drawings below, the same or corresponding elements have the same reference characters allotted and description thereof will not be repeated. In addition, an individual orientation, a collective orientation, an individual plane, and a collective plane are herein shown in [ ], < >, ( ), and { }, respectively. Moreover, in terms of crystallography, a negative index should be denoted by a number with a bar "–" thereabove, however, a negative sign herein precedes a number.

Figure 1:
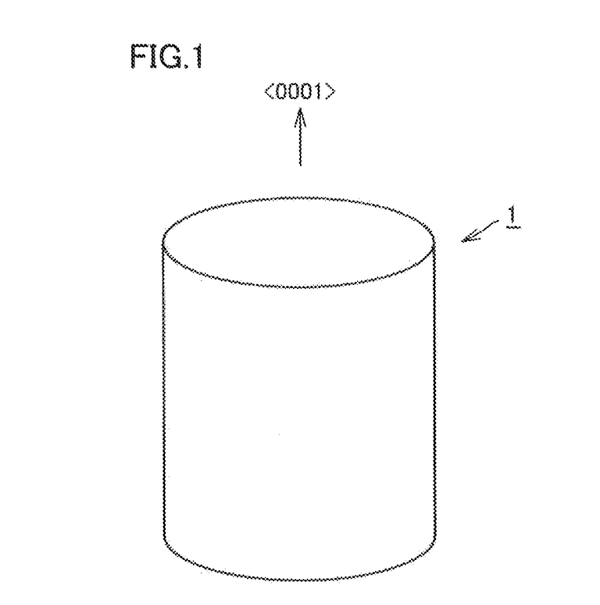
FIG. 1 is a schematic perspective view showing an ingot of single crystal silicon carbide.

Initially, a method of manufacturing a silicon carbide substrate in one embodiment of the present invention will be described. Referring to FIG. 1, in the method of manufacturing a silicon carbide substrate in the present embodiment, initially, the step of preparing a crystal (an ingot) of single crystal silicon carbide is performed. Specifically, for example with a sublimation method described below, an ingot of single crystal silicon carbide is fabricated. Namely, a seed crystal composed of single crystal silicon carbide and source material powders composed of silicon carbide are initially placed in a container composed of graphite. Then, silicon carbide sublimates as the source material powders are heated and silicon carbide is recrystallized on the seed crystal. Here, recrystallization proceeds while a desired impurity such as nitrogen is being introduced. Thus, an ingot 1 of single crystal silicon carbide shown in FIG. 1 is obtained. Here, by setting a direction of growth of ingot 1 to the <0001> direction as shown in FIG. 1, ingot 1 can efficiently be fabricated.

Then, the silicon carbide substrate is fabricated by cutting fabricated ingot 1. Specifically, referring to FIG. 2, initially, fabricated ingot 1 in a shape of a pillar (a column) is set such that a part of a side surface thereof is supported by a support base 2. Then, a wire 9 comes closer to ingot 1 along a cutting direction α which is a direction perpendicular to a direction of running while the wire runs in a direction along a direction of a diameter of ingot 1, so that wire 9 and ingot 1 come in contact with each other. Then, as wire 9 continues to move along cutting direction α, ingot 1 is cut. More specifically, a cutting liquid such as slurry in which single crystal diamond serving as loose abrasive grains and a cutting oil have been mixed is supplied to a region where wire 9 composed, for example, of an alloy containing iron and nickel runs in contact with ingot 1 and wire 9 and ingot 1 come in contact with each other, and thus ingot 1 is cut. Thus, a silicon carbide substrate 3 shown in FIG. 3 is obtained. Thereafter, a main surface of silicon carbide substrate 3 is planarized, for example, by polishing, and thus silicon carbide substrate 3 in the present embodiment is completed.

Figure 2:
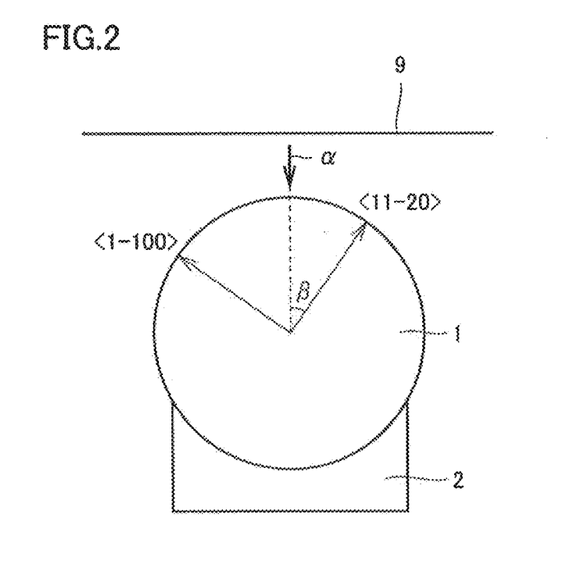
FIG. 2 is a schematic plan view showing a method of cutting an ingot.
Figure 3:
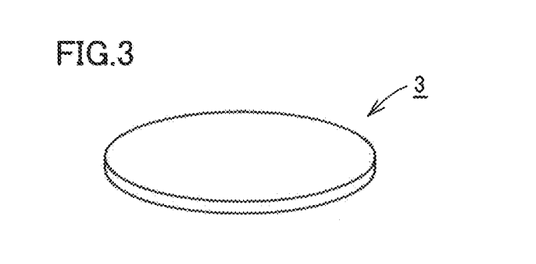
FIG. 3 is a schematic perspective view showing a silicon carbide substrate.

Here, referring to FIG. 2, in cutting (slicing) ingot 1 with wire 9, cutting proceeds along cutting direction α in which an angle formed with respect to the <11-20> direction or the <1-100> direction of ingot 1 is 15°±5° in an orthogonal projection on the {0001} plane. More specifically, for example as shown in FIG. 2, an angle β formed between the <11-20> direction of ingot 1 and cutting direction α is set to 15°±5°. Thus, influence on wire 9 by the cleavage direction is lessened and occurrence of warpage of silicon carbide substrate 3 is suppressed. Consequently, even though the main surface of silicon carbide substrate 3 obtained by cutting is planarized by polishing or the like, variation in plane orientation in the main surface is suppressed. In addition, a value of angle β above is more preferably 15°±2°.

Here, in a case where ingot 1 (silicon carbide substrate 3) has a diameter not smaller than 2 inches or a case where D/T of silicon carbide substrate 3 is not smaller than 100, warpage above tends to be greater. Therefore, the method of manufacturing silicon carbide substrate 3 in the present embodiment capable of lessening warpage above is particularly effective under such a condition.

In addition, since warpage above is more likely in cutting with wire 9 which is likely to bend during cutting, the method of manufacturing silicon carbide substrate 3 in the present embodiment capable of lessening warpage above is particularly effective for cutting ingot 1 by wire cutting.

EXAMPLES

Example 1

An experiment for comparing a state of a main surface of a silicon carbide substrate in the method of manufacturing a silicon carbide substrate according to the present invention with a state of a main surface of a conventional silicon carbide substrate was conducted. A procedure in the experiment is as follows.

Initially, an ingot of single crystal silicon carbide was prepared as in the embodiment above, and the silicon carbide substrate was obtained by carrying out such wire cutting that cutting proceeds in a direction along the cleavage direction while the ingot is supported by support base 2. Then, the main surface of the silicon carbide substrate was planarized by polishing (the conventional example). On the other hand, in a similar procedure, the silicon carbide substrate was obtained by carrying out such wire cutting that cutting proceeds in a direction in which an angle formed with respect to the cleavage direction is 15°. Then, the main surface of the silicon carbide substrate was planarized by polishing (the example). A shape of the main surface of the silicon carbide substrate in a state after cutting and before planarization of the silicon carbide substrate thus obtained and a state after planarization thereof was examined. FIGS. 4 to 7 show experimental results. It is noted that a numeric value in FIGS. 4 to 7 shows a height from a reference plane.

Figure 4:
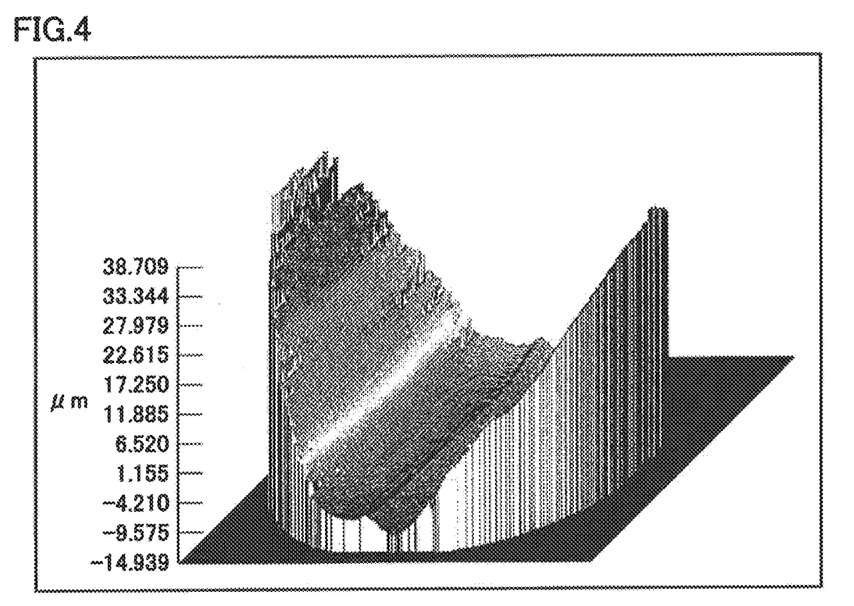
FIG. 4 is a diagram showing a shape of a main surface of a substrate obtained by such wire cutting that cutting proceeds in a direction along a cleavage direction.
Figure 5:
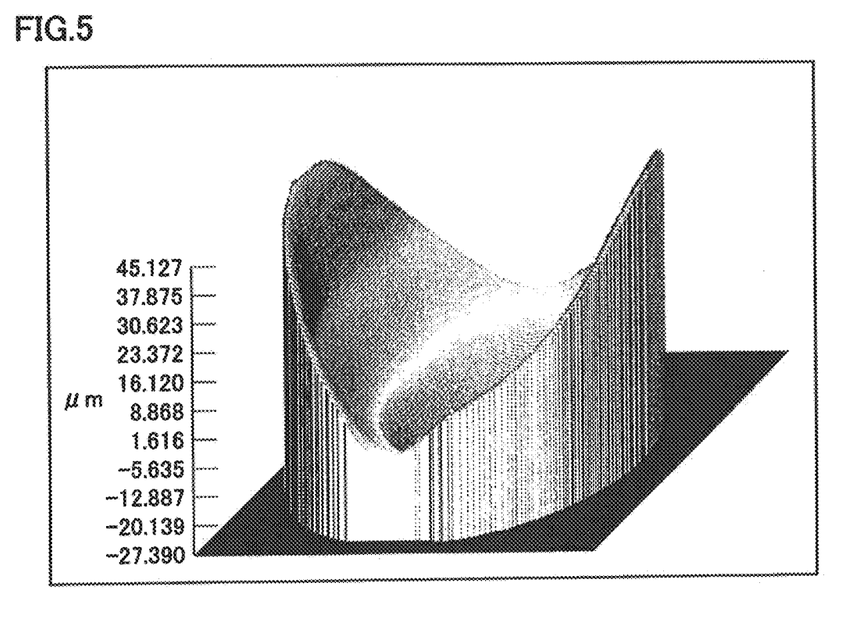
FIG. 5 is a diagram showing a shape of the main surface of the substrate obtained by performing such wire cutting that cutting proceeds in a direction along the cleavage direction and thereafter polishing the surface.
Figure 6:
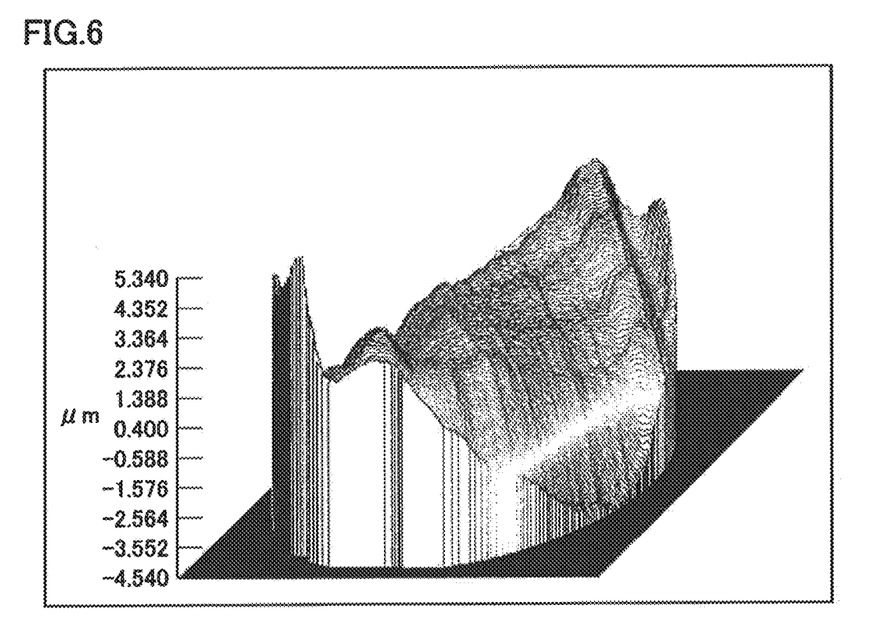
FIG. 6 is a diagram showing a shape of the main surface of the substrate obtained by performing such wire cutting that cutting proceeds in a direction in which an angle formed with respect to the cleavage direction is 15°.
Figure 7:
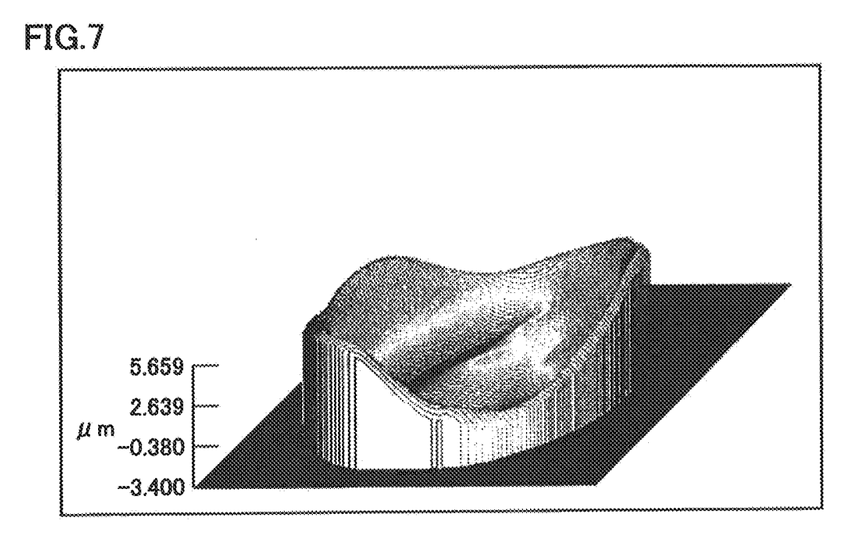
FIG. 7 is a diagram showing a shape of the main surface of the substrate obtained by performing such wire cutting that cutting proceeds in a direction in which an angle formed with respect to the cleavage direction is 15° and thereafter polishing the surface.

Referring to FIGS. 4 and 5, in a case of the cutting method in the conventional example, warpage of the surface was great and warpage was great even after planarization although surface roughness was improved by planarization. In contrast, referring to FIGS. 6 and 7, in a case of the cutting method in the example of the present invention, warpage of the surface was significantly improved at the time point of cutting and surface roughness was improved by planarization. Thus, it was confirmed that, according to the method of manufacturing a silicon carbide substrate in the present invention, occurrence of warpage was suppressed as compared with a case of adoption of the conventional cutting method, and even though the substrate is planarized by polishing or the like, variation in plane orientation in the main surface could significantly be suppressed.

Example 2

Figure 8:
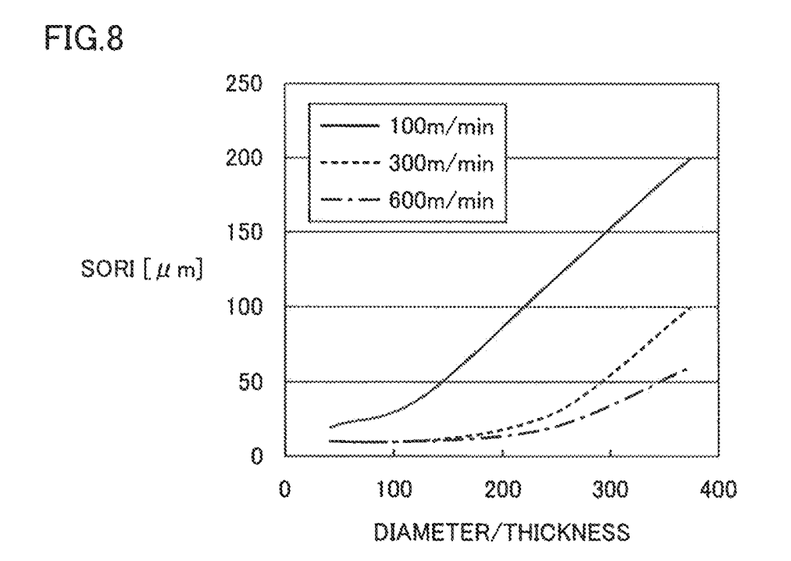
FIG. 8 is a diagram showing relation between D/T and warpage in a case where a linear velocity during wire cutting is changed.
Figure 9:
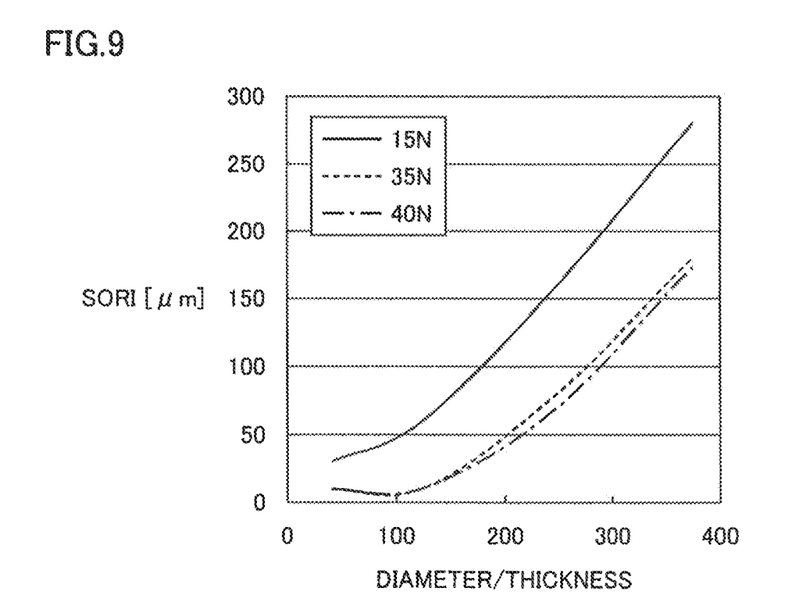
FIG. 9 is a diagram showing relation between D/T and warpage in a case where tensile force of a wire during wire cutting is changed.
Figure 10:
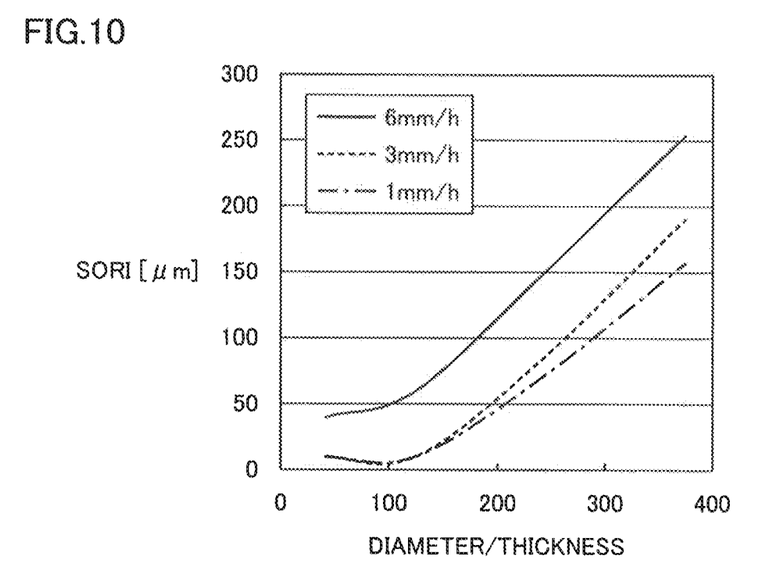
FIG. 10 is a diagram showing relation between D/T and warpage in a case where a cutting speed during wire cutting is changed.
Figure 11:
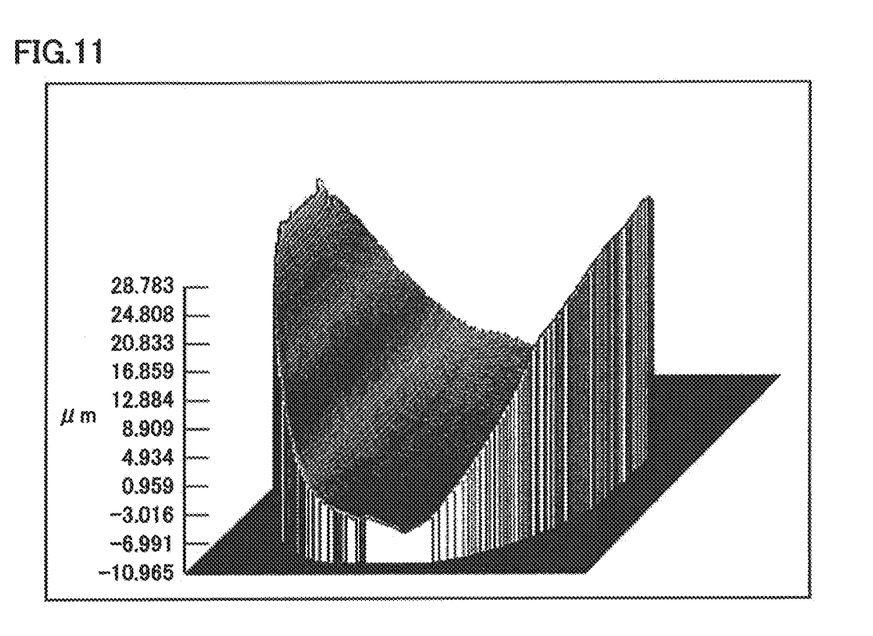
FIG. 11 is a diagram showing a shape of the main surface of the substrate obtained by performing such wire cutting that cutting proceeds in a direction in which an angle formed with respect to a <1-100> direction is 0°.
Figure 12:
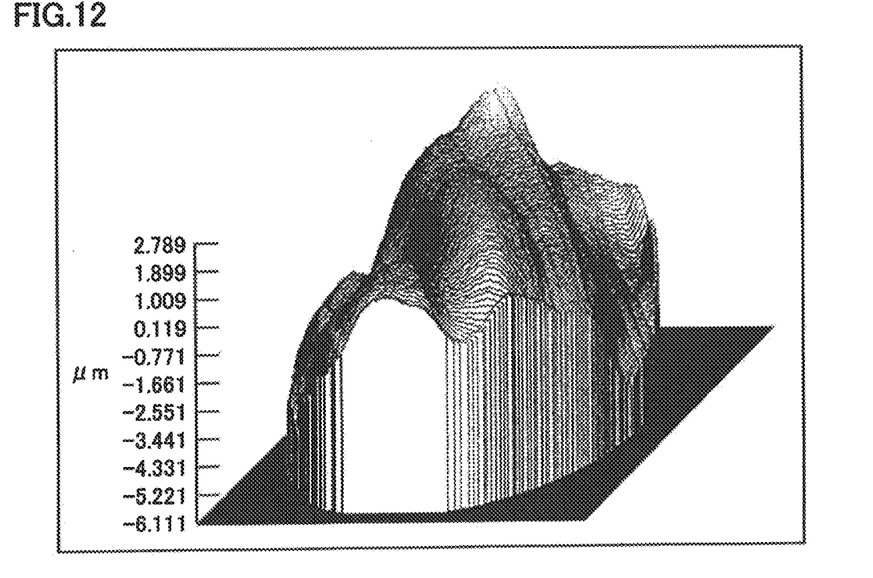
FIG. 12 is a diagram showing a shape of the main surface of the substrate obtained by performing such wire cutting that cutting proceeds in a direction in which an angle formed with respect to the <1-100> direction is 15°.
Figure 13:
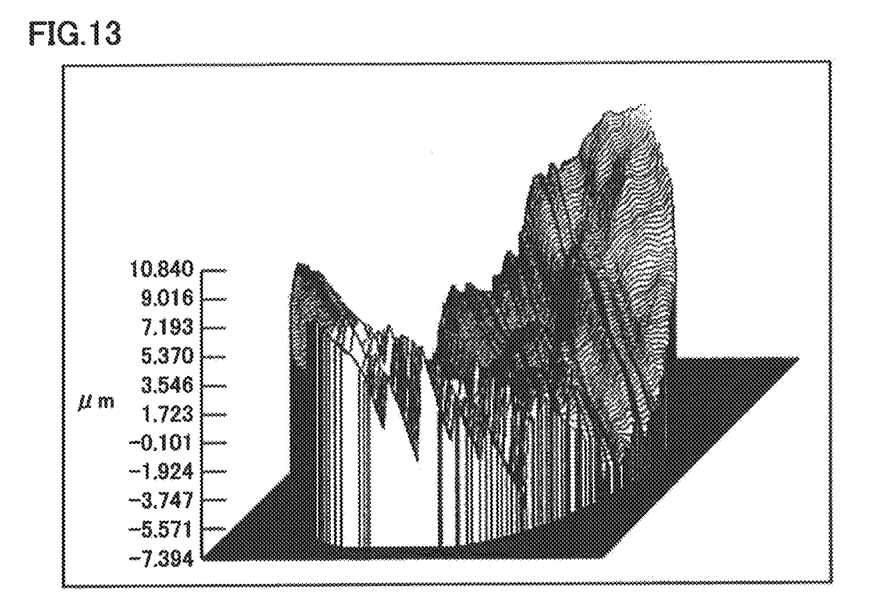
FIG. 13 is a diagram showing a shape of the main surface of the substrate obtained by performing such wire cutting that cutting proceeds in a direction in which an angle formed with respect to the <1-1.00> direction is 20°.
Figure 14:
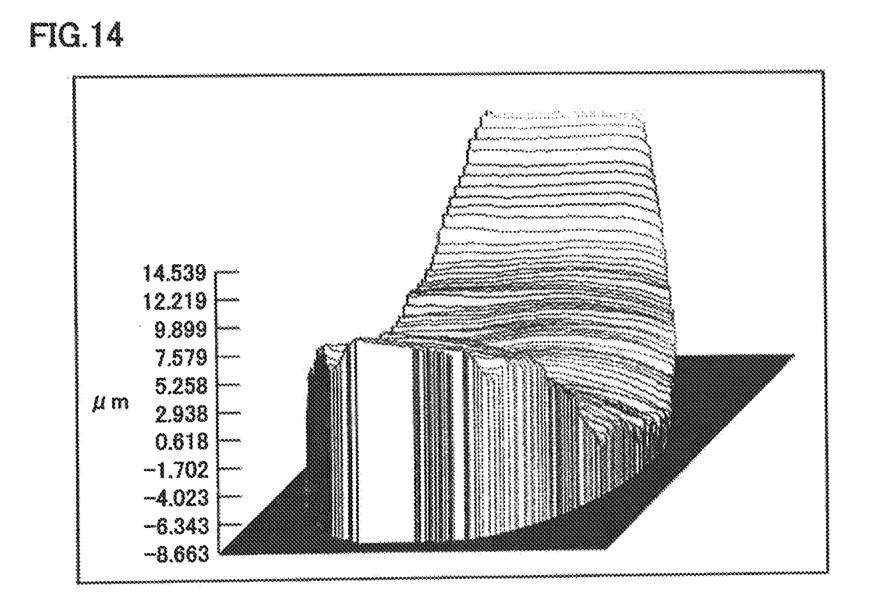
FIG. 14 is a diagram showing a shape of the main surface of the substrate obtained by performing such wire cutting that cutting proceeds in a direction in which an angle formed with respect to the <1-100> direction is 30°.

An experiment for examining relation between a value for diameter D to thickness T (D/T) of the silicon carbide substrate in the method of manufacturing a silicon carbide substrate according to the present invention and warpage of the substrate was conducted. The experiment was conducted in a case of change in linear velocity during wire cutting, a case of change in tensile force of the wire, and a case of change in a cutting speed. FIGS. 8 to 10 show experimental results. It is noted that, in FIGS. 8 to 10, the abscissa represents a value for D/T and the ordinate represents a value for warpage (SORI). FIG. 8 shows experimental results in a case where a linear velocity of the wire is from 100 m/min to 600 m/min, FIG. 9 shows a case where tensile force of the wire is from 15 N to 40 N, and FIG. 10 shows a case where a cutting speed is from 1 mm/h to 6 mm/h.

Referring to FIGS. 8 to 10, under any condition, when a value for D/T is not smaller than 100, warpage is particularly great. Therefore, it can be concluded that the method of manufacturing a silicon carbide substrate according to the present invention capable of lessening warpage is suitable particularly for a case where a value for D/T is not smaller than 100.

In addition, referring to FIG. 8, warpage is lessened as a linear velocity of the wire increases. As the linear velocity increases from 100 m/min to 300 m/min, warpage is significantly lessened. On the other hand, as the linear velocity is increased from 300 m/min to 600 m/min, however, an amount of decrease in warpage is smaller than in a case of increase from 100 m/min to 300 m/min. Further, when the linear velocity above exceeds 700 m/min, the wire is more likely to slip with respect to the ingot and slicing is less likely to proceed. Therefore, it is considered that the linear velocity of the wire is preferably not less than 300 m/min and not more than 700 m/min.

Referring further to FIG. 9, as tensile force of the wire increases, warpage is lessened. As tensile force increases from 15 N to 35 N, warpage is significantly lessened. On the other hand, as tensile force is increased from 35 N to 40 N, however, air amount of decrease in warpage is smaller than in a case where tensile force is increased from 15 N to 35 N. When tensile force exceeds 50 N, the wire may be broken. Therefore, it is considered that tensile force of the wire is preferably not less than 35 N and not more than 50 N.

Referring further to FIG. 10, as a cutting speed is lowered, warpage is lessened. Then, as a cutting speed is lowered from 6 mm/h to 3 mm/h, warpage is significantly lessened. On the other hand, as a cutting speed is lowered from 3 mm/h to 1 mm/h, however, an amount of decrease in warpage is smaller than in a case where a cutting speed is lowered from 6 mm/l to 3 mm/h. In addition, when a cutting speed is lower than 1 mm/h, the wire slicked by such a cutting liquid as slurry runs over the ingot substantially without advancing, which leads to a great cutting width and resultant lower yield. Therefore, it is considered that a cutting speed is preferably not lower than 1 mm/h and not higher than 3 mm/h.

Example 3

An experiment for examining influence on warpage (SORI) of an obtained substrate by an angle formed between a direction in which cutting proceeds and the cleavage direction in an orthogonal projection on the {0001} plane in obtaining a substrate by cutting an ingot of single crystal silicon carbide was conducted.

Initially, as in the embodiment above, an ingot of single crystal silicon carbide was prepared, and a silicon carbide substrate was obtained by slicing the ingot such that an angle formed with respect to the <1-100> direction representing the cleavage direction was from 0° to 30° in the orthogonal projection on the {0001} plane while the ingot was supported on support base 2. Then, SORI of the main surface of the obtained substrate was measured. Table 1 shows measurement results. In addition, FIGS. 11 to 14 each show a shape of the main surface of the obtained substrate.

TABLE 1

| | Angle Between Direction in Which Cutting Proceeds and <1-100> Direction (°) | | | | | | |
|---|---|---|---|---|---|---|---|
| | 0 | 10 | 13 | 15 | 17 | 20 | 30 |
| SORI (μm) | 39 | 26 | 10 | 8 | 11 | 18 | 28 |

Referring to Table 1 and FIGS. 11 to 14, as the angle formed between the direction in which cutting proceeds and the <1-100> direction representing the cleavage direction is closer to 15°, a value for SORT of the substrate main surface is smaller. Then, it is confirmed that a value for SORI of the substrate main surface can effectively be lowered by setting the angle formed between the direction in which cutting proceeds and the <1-100> direction to 15°±5°, in addition, it was found that a value for SORI of the substrate main surface could further be lowered by setting the angle formed between the direction in which cutting proceeds and the <1-100> direction to 1.5°±2°.

The method of manufacturing a silicon carbide substrate according to the present invention is particularly advantageously applicable to manufacturing of a silicon carbide substrate required to achieve suppressed variation in plane orientation in a main surface.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a silicon carbide substrate, comprising the steps of:
    preparing a crystal of single crystal silicon carbide having a cleavage direction that appears every 30 degrees in an orthogonal projection on a {0001} plane;
    setting said crystal on a support base such that a part of a side surface of said crystal is supported by said support base; and
    obtaining a substrate by cutting said crystal while running a wire along a direction of a diameter of said crystal and moving said wire in a direction perpendicular to a running direction of said wire, wherein
    in said step of obtaining a substrate, the cutting of said crystal proceeds in a direction in which an angle formed with respect to a <11-20> direction or a <1-100> direction of said crystal is 15°±5° in the orthogonal projection on the {0001} plane, and
    in said step of obtaining a substrate, said crystal is cut such that a ratio of a diameter to a thickness of said substrate is not smaller than 100.

2. The method of manufacturing a silicon carbide substrate according to claim 1, wherein
    in said step of obtaining a substrate, cutting proceeds in a direction in which an angle formed with respect to the <11-20> direction or the <1-100> direction of said crystal is 15°±2° in an orthogonal projection on a {0001} plane.

3. The method of manufacturing a silicon carbide substrate according to claim 1, wherein
    said crystal grows in a <0001> direction.

4. The method of manufacturing a silicon carbide substrate according to claim 1, wherein
    said crystal has a diameter not smaller than 2 inches.

5. The method of manufacturing a silicon carbide substrate according to claim 1, wherein
    a feed speed of said wire is not less than 300 m/min and not more than 700 m/min.

6. The method of manufacturing a silicon carbide substrate according to claim 1, wherein
    a tensile force of said wire is not less than 35 N and not more than 50 N.

7. The method of manufacturing a silicon carbide substrate according to claim 1, wherein
    a cutting speed of said crystal is not less than 1 mm/h and not more than 3 mm/h.

* * * * *